United States Patent
Noda et al.

[11] Patent Number: 6,057,512
[45] Date of Patent: May 2, 2000

[54] FLEXIBLE PRINTED CIRCUITRY WITH PSEUDO-TWISTED CONDUCTORS

[75] Inventors: Atsuhito Noda, Hachiohji; Masato Okano, Machida, both of Japan

[73] Assignee: Molex Incorporated, Lisle, Ill.

[21] Appl. No.: 08/998,437

[22] Filed: Dec. 26, 1997

[30] Foreign Application Priority Data

Dec. 27, 1996 [JP] Japan .................. 8-357850

[51] Int. Cl.$^7$ .................................. H05K 1/00
[52] U.S. Cl. ............... 174/250; 174/254; 174/255; 361/749; 333/12; 439/941
[58] Field of Search ............... 174/250, 255, 174/254, 33, 32, 34, 117 FF; 361/749; 439/941; 333/1, 12

[56] References Cited

U.S. PATENT DOCUMENTS

| | | | |
|---|---|---|---|
| 392,775 | 11/1888 | Barrett | 174/33 |
| 1,792,273 | 2/1931 | Byk et al. | |
| 3,104,363 | 9/1963 | Butler | |
| 3,761,842 | 9/1973 | Gandrud | 333/1 |
| 3,764,727 | 10/1973 | Balde | 174/34 |
| 4,034,148 | 7/1977 | Lang | 174/34 |
| 4,359,597 | 11/1982 | Paquin et al. | 174/34 |
| 4,593,243 | 6/1986 | Lao et al. | 324/754 |
| 5,186,647 | 2/1993 | Denkmann et al. | 439/395 |
| 5,298,680 | 3/1994 | Kenny | 174/36 |
| 5,310,363 | 5/1994 | Brownell et al. | 439/676 |
| 5,362,257 | 11/1994 | Neal et al. | 439/676 |
| 5,459,284 | 10/1995 | Bockelman et al. | 174/34 |
| 5,527,996 | 6/1996 | Ham | 174/113 R |
| 5,618,185 | 4/1997 | Aekins | 439/76.1 |

*Primary Examiner*—Dean A. Reichard
*Assistant Examiner*—Dhiru R Patel
*Attorney, Agent, or Firm*—Charles S. Cohen

[57] ABSTRACT

A flexible printed circuitry member includes a generally planar dielectric substrate. First and second pseudo-twisted conductors are disposed on opposite sides of the substrate and extend longitudinally in a pattern of twist sections between crossover points whereat the conductors cross over each other separated by the dielectric substrate. The crossover points define a centerline with the first and second conductors reversing each other on opposite sides of the centerline at each crossover point. The twist sections between crossover points along the centerline are of randomly differing lengths.

17 Claims, 3 Drawing Sheets

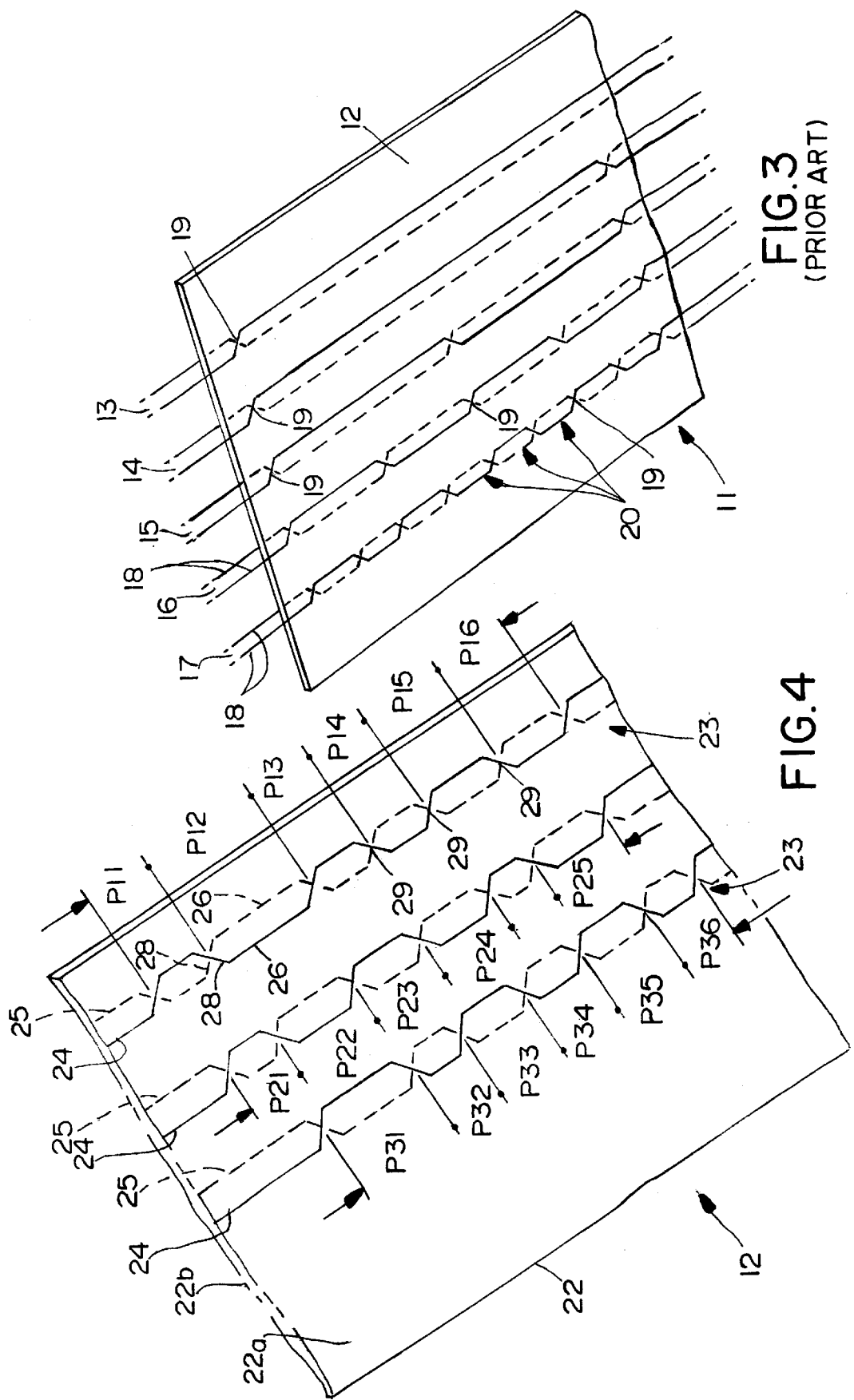

FLEXIBLE PRINTED CIRCUITRY WITH PSEUDO-TWISTED CONDUCTORS

FIELD OF THE INVENTION

This invention generally relates to the art of electrical cables and, particularly, to flexible printed circuitry or cable. Specifically, the invention relates to flexible printed circuitry with minimal crosstalk noise between adjacent "twisted" pairs of conductors and reduced propagation time differential between the pairs.

BACKGROUND OF THE INVENTION

High speed data transmission between complex electronic gear such as computers and their peripherals is commonly achieved through round multi-conductor cable assemblies. Inherent with high speed data transmission and multi-conductor cables are problems associated with electromagnetic interference. The interference between conductors can create "crosstalk" and "noise," which can cause erroneous data transmission.

One type of cable used to reduce such effects is "twisted pair" cable, in which two adjacent conductors or differential pairs are twisted, thereby reversing the lateral position of each conductor at each twist. The benefits of this configuration are two fold.

First, the position of the wires is constantly being reversed. Therefore any exterior magnetic or electric field has a generally uniform effect upon a given differential pair. This uniformity reduces the harmful effects of exterior electromagnetic fields and lessens the chances of erroneous data transmission.

Second, when current runs through a conductor, an electromagnetic field is generated. The field's orientation is dependent upon the direction of the current flow. For a given differential pair, electric currents generally flow in opposite directions. Therefore, the electromagnetic field radiating from each conductor generally has a canceling effect upon the other. This canceling effect can substantially suppress the radiated emissions from a given differential pair.

Flat flexible printed circuitry or cable ("FPC") is another medium used for high speed data transmission between computers and their peripherals. A "pseudo-twisted" arrangement can be achieved with such circuitry by placing conductors of a given pair on opposite sides of an insulative carrier, with their paths slightly and oppositely offset with respect to a common nominal path locator, and then periodically reversing the offset at predetermined locations. An example of the "pseudo-twisted" flat flexible printed circuitry arrangement is shown in U.S. Pat. No. 3,761,842, dated Sep. 25, 1973.

Although twisted pair electrical cable or pseudo-twisted flat flexible printed circuitry has proven quite effective in reducing or eliminating crosstalk or noise between the adjacent conductors of a given twisted pair, there may also be a problem with crosstalk and noise between adjacent pairs of twisted conductors. The aforementioned U.S. Pat. No. 3,761,842 attempts to solve this problem in a pseudo-twisted flexible printed circuit having pairs of conductors, and each pair has a differing number of twists per unit length. While this arrangement reduces the crosstalk between adjacent twisted pairs of conductors, the arrangement creates further problems in that each twisted pair inevitably has a different conductor path length which results in high frequency signals travelling along the circuit not arriving at the terminating end simultaneously. Therefore, such an arrangement creates a propagation time differential or signal skew between the pairs of conductors of the circuit unless compensation is made for this difference in path length. In U.S. Pat. No. 3,761,842, the path width d is varied to compensate for the differences in path lengths (see, column 3, lines 1–11 of that patent).

The present invention is directed to solving this myriad of problems in a unique flexible circuit wherein the individual pairs of pseudo-twisted conductors have random numbers of twists per unit length.

SUMMARY OF THE INVENTION

An object, therefore, of the invention is to provide new and improved flat printed circuitry of the character described.

In the exemplary embodiment of the invention, the circuitry includes an elongated flexible insulating substrate. First and second pseudo-twisted flexible conductors are disposed on opposite sides of the substrate. Each conductor includes alternating straight and oblique sections with a straight-to-oblique transition between the straight and oblique sections. The straight sections of the conductors are generally parallel to each other. The oblique sections of the conductors cross each other at crossover points. The straight sections of the conductors between any two immediately successive crossover points are generally of equal lengths. The straight sections of the conductors between the crossover points lengthwise of the substrate are of random lengths. However, each pair of pseudo-twisted flexible conductors has an identical number of twists per a predetermined substantial unit length.

The invention contemplates that the random length of the twisted conductors between any two immediately successive crossover points range from 0.5 to 1.5 times a given medium length. Preferably, the straight sections of the conductors are of uniform width. In another aspect of the present invention, each oblique section decreases in width uniformly in a direction from the transition to an adjacent crossover point.

In still another aspect of the present invention, a flexible printed circuitry member is provided that includes a generally planar flexible dielectric substrate and first and second pseudo-twisted conductors on opposite sides of the substrate and extending longitudinally in a pattern of twist sections between crossover points whereat the conductors cross over each other separated by the dielectric substrate. The crossover points define a centerline with the first and second conductors reversing each other on opposite sides of the centerline at each crossover point. A pair of adjacent crossover points define a length of a respective twist section, and the length of each twist section between crossover points along the centerline is substantially randomly different over a substantial length of the flexible printed circuitry member. The random length of the twist sections between any two immediately successive crossover points range may be from 0.5 to 1.5 times a given medium length. In addition, the conductors along a substantial portion of each twist section may be of generally uniform width. Finally, the twist sections include portions that decrease in width uniformly and reach a minimum width at the crossover points.

In still another aspect of the present invention, a flexible printed circuitry member is provided that includes a generally planar flexible dielectric substrate and a plurality of adjacent pairs of first and second pseudo-twisted conductors positioned on opposite sides of the dielectric substrate. The first and second conductors of each pair are a substantial mirror image of each other about a longitudinal centerline of the pair with the first and second conductors of each pair including a crossover point at which the first and second conductors of each pair cross over each other and are separated by the dielectric substrate. The crossover points of each pair are positioned along the centerline with the first and second conductors reversing locations on opposite sides of the centerline. A pair of adjacent crossover points define a twist length of a respective twist section and the twist length varies over a length of said circuitry member. In addition, each twist length of a first pair of pseudo-twisted conductors is different from an adjacent laterally spaced twist length of a second pair of psuedo-twisted conductors.

The flexible printed circuitry member may include the second pair of psuedo-twisted conductors on one lateral side of the first pair and a third pair of psuedo-twisted conductors on an opposite lateral side of the first pair. Each twist length of the first pair of pseudo-twisted conductors may be different from adjacent laterally spaced twist lengths of both the second and third pairs of psuedo-twisted conductors.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 3 is a somewhat schematic illustration of a flexible printed circuit according to the prior art, wherein the pairs of conductors have differing numbers of twists per unit length;

FIG. 4 is a somewhat schematic illustration of a flexible printed circuit according to the concepts of the invention;

DETAILED DESCRIPTION OF THE PREFERRED EMBODIMENTS

Figure 1:
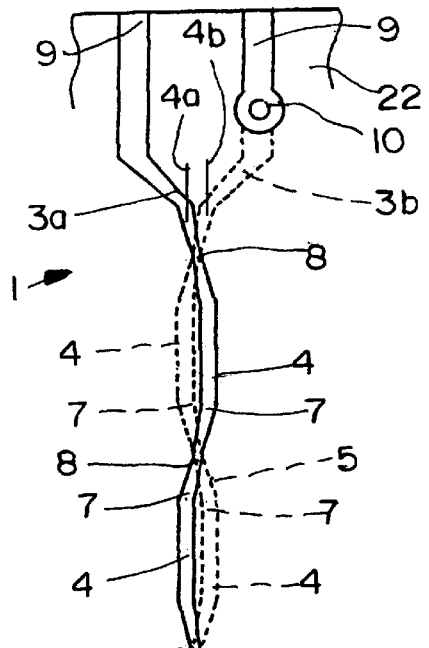
FIG. 1 is an enlarged, fragmented plan view of a pair of pseudo-twisted conductors of the prior art, along a length thereof involving two pseudo-twists of the conductors.
Figure 2:
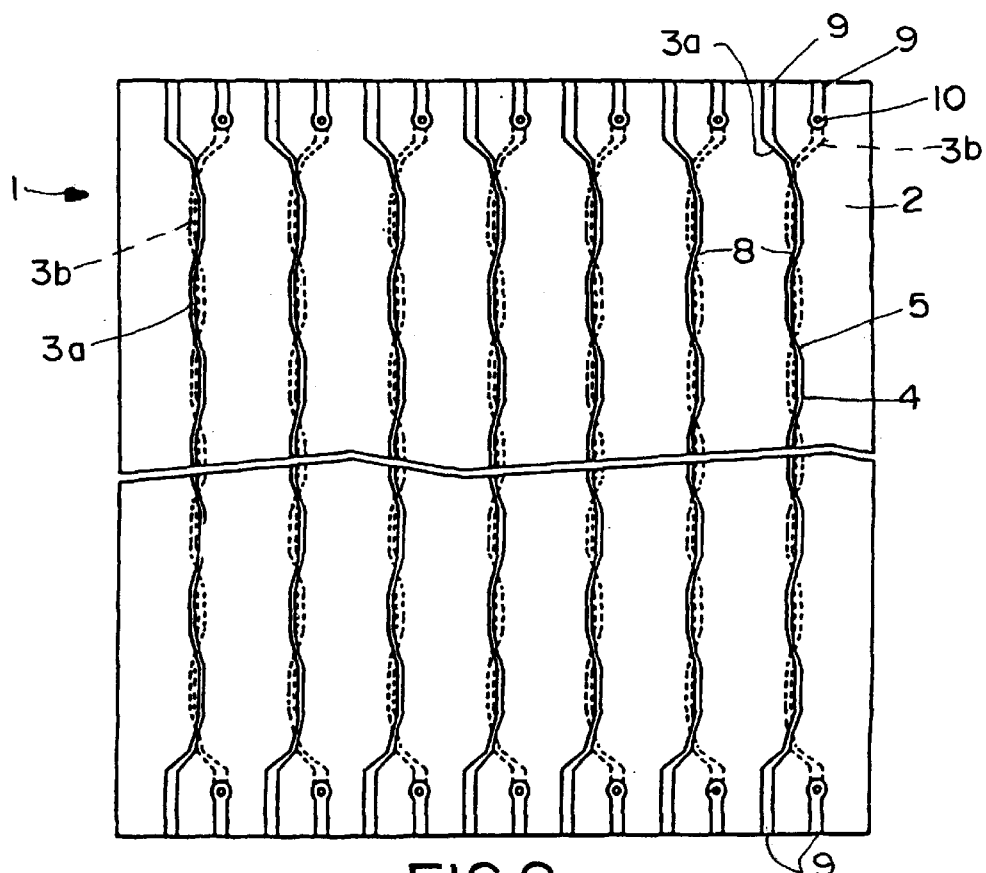
FIG. 2 is a fragmented plan view of a flexible printed circuit according to the prior art, incorporating a plurality of pairs of pseudo-twisted conductors.

Referring to the drawings in greater detail, and first to FIGS. 1 and 2, a flat flexible printed circuit or cable, generally designated 1, is shown according to the prior art. The circuitry includes a plurality of pairs of pseudo-twisted conductors 3a and 3b. One conductor 3a is disposed on one side or surface of a flexible dielectric substrate 2, and the other conductor 3b is disposed on the other side or surface of the substrate. In other words, each pair of conductors 3a and 3b sandwich flexible substrate 2 therebetween to form a pair of pseudo-twisted conductors.

Each conductor 3a and 3b runs lengthwise of the cable in an oscillating pattern formed by alternate straight sections 4 and oblique sections 5. These patterns of conductors 3a and 3b are arranged symmetrically but opposite to each other on opposite sides or surfaces of the flexible substrate. The straight sections 4 of the conductors are generally parallel to each other but alternate along two parallel but spaced apart lines 4a and 4b. The oblique sections 5 of each conductor connects a pair of adjacent straight sections 4 and thus extends between lines 4a and 4b. Since the conductors 3a and 3b are arranged symmetrically but opposite to each other, the straight sections 4 of the conductors are generally parallel but spaced apart both vertically and horizontally. In other words, when the straight section 4 of one conductor 3a is aligned with line 4a, the straight section 4 of the other conductor 3b is aligned with line 4b but on opposite sides of substrate 2, and vice versa. As a result, the oblique sections 5 of the conductors 3a and 3b cross each other at crossover points 8.

The straight sections 4 of conductors 3a and 3b have uniform or equal widths along the lengths thereof. Each oblique section 5 of each conductor, decreases in width uniformly in a direction from the straight-to-oblique transition point 7 of the respective conductor to the respective crossover point 8 of the conductors where it reaches its minimum width. Assuming that: 1) the thickness of conductors 3a and 3b (i.e., in a direction perpendicular to the plane of the cable) is uniform along the full length of the conductors; 2) the vertical distance between the conductors remains constant; and 3) the dielectric constant of the material between the conductors remains constant, the impedance increases with the decrease in the width of each oblique section 5.

The conductors 3a and 3b separately terminate in one of the pads 9 at an edge of flexible substrate 2. The pads of some of the conductors may include an associated through hole or via 10. These pads 9 are arranged at equal intervals along the edges of the flat flexible circuit for engagement with equally spaced contacts (not shown) of an associated electrical connector adapted for connecting flat flexible circuits. Therefore, either opposite edge of the flat flexible circuit having the pseudo-twisted conductors can be inserted into the electrical connector to establish a required electrical connection.

While FIGS. 1 and 2 show a flat flexible printed circuit with pseudo-twisted conductors to reduce crosstalk and noise between the conductors of any given twisted pair, FIG. 3 shows an arrangement of the prior art which attempts to reduce the crosstalk or noise between adjacent pairs of conductors. In other words, the prior art of FIG. 3 discloses a pseudo-twisted flat flexible circuitry having pairs of conductors, with each pair having a differing number of twists per unit length.

More particularly, FIG. 3 shows flat flexible circuitry, generally designated 11, which includes an elongated flexible insulating substrate 12 and a plurality of pairs 13, 14, 15, 16 and 17 of pseudo-twisted conductors 18. The conductors cross each other at crossover points 19. For any given length of the substrate 12 or circuitry 11, as represented in FIG. 3, pair 17 of conductors 18 has eight pseudo-twisted sections 20. Pair 16 has four twisted sections for the same unit length. Pair 15 has two twisted sections for the same unit length. Pair 14 has one twisted section for the same unit length. Pair 13 basically has no twisted sections in that the conductors of pair 13 have only one crossover point 19.

The prior art arrangement of FIG. 3 has the effect of reducing crosstalk between adjacent twisted pairs 13–17 of conductors 18. However, this arrangement has a disadvantage in that each pair of conductors has a different conductor length. Although this may not be significant for some applications, many types of modern technology require the use of higher frequency signals. Such high frequency signals travelling along the pseudo-twisted pairs of conductors of different lengths will not arrive at a terminating end of the circuit simultaneously. Unless this problem is addressed (for example, the width of the conductors may be varied (see in this regard, column 3, lines 1–11 of U.S. Pat. No. 3,761,842 discussed above)), an undesirable propagation time differential or skew may occur.

FIG. 4 shows flat flexible printed circuitry or cable, generally designated 21, according to the concepts of the present invention. Generally, circuitry 21 of the invention not only reduces crosstalk between the twisted conductors in any given pair thereof, but the arrangement also reduces the crosstalk between adjacent pairs of conductors without creating an undesirable propagation time differential among the respective pairs of conductors.

More particularly, flexible printed circuit 21 again includes an elongated flexible insulating substrate 22 having opposite sides 22a and 22b. Each pair 23 of pseudo-twisted conductors include a conductor 24 on one side 22a of the substrate, and a second conductor 25 on the opposite side 22b of the substrate. Each conductor includes alternating straight and oblique sections 26 and 28, respectively. The straight sections 26 are generally parallel to each other. The oblique sections 28 cross each other at periodic crossover points 29. Therefore, each pair of pseudo-twisted conductors define "twists" or twisted sections lengthwise of the flexible circuitry.

Generally, the invention contemplates that the twisted sections in each pair 23 of pseudo-twisted conductors 24 and 25 have randomly different lengths along the flexible printed circuitry. As such, they are aperiodic over a predetermined substantial length of flexible printed circuitry. However, each pair of pseudo-twisted conductors has an equal number of twisted sections per some predetermined unit length of circuitry. Specifically, referring to FIG. 4, twisted sections $P_{11}$–$P_{16}$ in the left-hand pair of conductors (as viewed in FIG. 4) have randomly differing lengths. Similarly, the center pair of conductors (as viewed in FIG. 4) also has twisted sections $P_{21}$–$P_{26}$ of randomly differing lengths. Continuing, the pseudo-twisted conductors of the right-hand pair (as viewed in FIG. 4) have twisted sections $P_{31}$–$P_{36}$ of randomly differing lengths. In other words, the distance between crossover points 29 in the pairs of pseudo-twisted conductors 24 and 25 have randomly differing lengths along a predetermined substantial length of substrate 22 and circuit member 21. Through such a configuration, crosstalk between adjacent pairs of psueo-twisted conductors can be reduced. As shown in FIG. 4, however, each pair of conductors has an equal number of crossover points 29 and thus and equal number of straight sections 26 and oblique section. As a result, the path length along all conductors is equal and therefore signal skew is avoided. It should be noted that in actual applications, the pattern of twists may be repeated so long as the underlying goals and intent of the invention are achieved.

It has been found that the random location of crossover points for the conductors reduces crosstalk and noise between adjacent pairs of conductors. It also has been found that the propagation time differential skew between pairs of conductors is reduced or substantially eliminated by this random location of crossover points because random statistics dictate that the conductors are of substantially the same length per some predetermined significant unit length of the circuitry. To that end, one embodiment of the invention has utilized the lengths of the randomly differing twist sections as being within a range from 0.5 to 1.5 times a given medium length as determined by random statistics.

Figure 5:
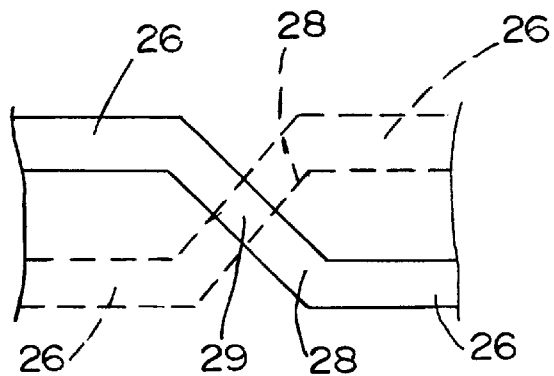
FIG. 5 is an enlarged plan view of one embodiment of the crossover point between a pair of twisted conductors.
Figure 6:
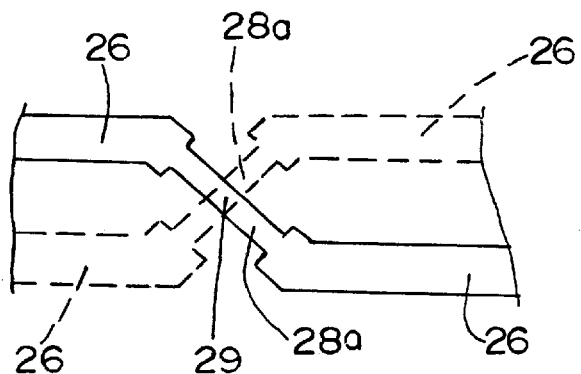
FIG. 6 is a view similar to that of FIG. 5, but of another embodiment of a crossover point between a pair of conductors.
Figure 7:
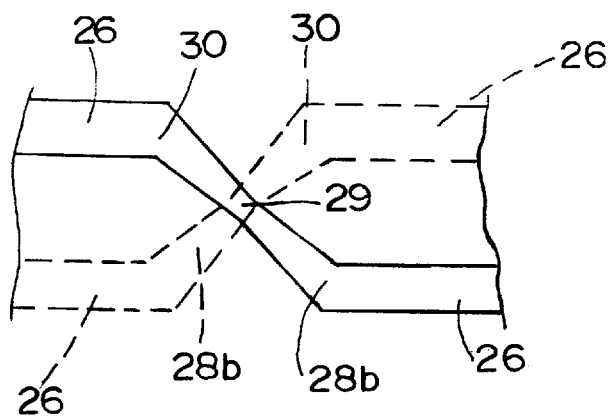
FIG. 7 is a view similar to that of FIGS. 5 and 6 of still another embodiment of a crossover point between a pair of twisted conductors.

FIGS. 5–7 show various configurations of crossover points 29 between oblique sections 28 of the conductors. In FIG. 5, the oblique sections through the crossover points are substantially the same width as straight sections 26 of the conductors. In FIG. 6, oblique sections 28A are abruptly reduced in width versus the width of straight sections 26. In FIG. 7, oblique sections 28B gradually taper from transition points 30 with the straight sections to the crossover point 29 of the oblique sections.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A flexible printed circuitry member, comprising;

an elongated flexible insulating substrate; and first and second pseudo-twisted flexible conductors on opposite sides of said substrates each of said first and second pseudo-twisted flexible conductors including alternating straight and oblique sections with a straight-to-oblique transition between the straight and oblique sections, the straight sections of said first and second pseudo-twisted flexible conductors being generally parallel to each other, the oblique sections of said first and second pseudo-twisted flexible conductors crossing each other at periodic crossover points so as to form a plurality of twist sections, the straight sections of said first and second pseudo-twisted flexible conductors within each of said plurality of twist sections being generally of equal lengths, and each of said plurality of twist sections includes a substantially randomly differing length between any two immediately successive crossover points.

2. The flexible printed circuitry member of claim 1 wherein the randomly differing length of each of said plurality of twist sections between any two of said immediately successive crossover points range from 0.5 to 1.5 times a given medium length.

3. The flexible printed circuitry member of claim 1 wherein the straight sections of said first and second pseudo-twisted flexible conductors are of uniform width.

4. The flexible printed circuitry member of claim 1, including a plurality of pairs of said first and second pseudo-twisted flexible conductors laterally spaced apart on said substrate.

5. The flexible printed circuitry member of claim 1, wherein each of said oblique sections decreases in width uniformly in a direction from said straight-to-oblique transition to an adjacent one of said crossover points.

6. A flexible printed circuitry member, comprising:

a generally planar flexible dielectric substrate; and first and second pseudo-twisted conductors on opposite sides of the dielectric substrate and extending longitudinally in a plurality of twist sections between crossover points whereat said first and second pseudo-twisted conductors cross over each other separated by the dielectric substrate, the crossover points defining a centerline with the first and second pseudo-twisted conductors reversing each other on opposite sides of the centerline at each of said crossover points, an adjacent pair of said crossover points defining a length of one of said plurality of twist sections, and the length of each of said plurality of twist sections between said adjacent pair of said crossover points along the centerline being substantially randomly different over a substantial length of said flexible printed circuitry member.

7. The flexible printed circuitry member of claim 6 wherein the length of each of said plurality of twist sections between said adjacent pair of said crossover points range from 0.5 to 1.5 times a given medium length.

8. The flexible printed circuitry member of claim 6 wherein said first and second pseudo-twisted conductors along a substantial portion of each of said plurality of twist sections are of generally uniform width.

9. The flexible printed circuitry member of claim 6, including a plurality of said first and second pseudo-twisted conductors, in pairs, laterally of the dielectric substrate.

10. The flexible printed circuitry member of claim 6, wherein each of said plurality of twist sections includes a portion that decreases in width uniformly and reaches a minimum width at each of said crossover point.

11. A flexible printed circuitry member, comprising:

a generally planar flexible dielectric substrate, a plurality of adjacent pairs of first and second pseudo-twisted conductors positioned on opposite sides of said dielectric substrate so as to form a plurality of twist sections, the first and second pseudo conductors of each of said pairs of said first and second pseudo-twisted conductors being a substantial mirror image of each other about a longitudinal centerline of each of said pairs of said first and second pseudo-twisted conductors, said first and second pseudo-twisted conductors of each of said pairs of said first and second pseudo-twisted conductors including crossover points at which said first and second pseudo-twisted conductors of each of said pairs of said first and second pseudo-twisted conductors cross over each other and are separated by said dielectric substrate, said crossover points of each of said pairs of said first and second pseudo-twisted conductors being positioned along said centerline with said first and second pseudo-twisted conductors reversing locations on opposite sides of said centerline, an adjacent pair of crossover points defining a twist length of each of said plurality of twist sections, said twist length varying over a length of said circuitry member; and each said twist length of a first one of said adjacent pairs of said first and second pseudo-twisted conductors being different from an adjacent laterally spaced twist length of a second one of said adjacent pairs of said first and second pseudo-twisted conductors.

12. The flexible printed circuitry member of claim 11, wherein said second one of said adjacent pairs of first and second pseudo-twisted conductors is positioned on one lateral side of said first one of said adjacent pairs of said first and second pseudo-twisted conductors and a third one of said adjacent pairs of first and second pseudo-twisted conductors is positioned on an opposite lateral side of said first one of said adjacent pairs of first and second pseudo-twisted conductors, each twist length of said first one of said adjacent pairs of first and second pseudo-twisted conductors being different from adjacent laterally spaced twist lengths of both said second and third ones of said adjacent pairs of first and second pseudo-twisted conductors.

13. The flexible printed circuitry member of claim 11, wherein each or said first and second pseudo-twisted conductors includes a transition section extending from a peak location a maximum distance from its respective centerline to one of said crossover points, said transition section decreasing in width uniformly in a direction from said peak location to said one of said crossover points whereby the width of each of said first and second pseudo-twisted conductors is at a maximum at said peak location and at a minimum at said one of said crossover points.

14. The flexible printed circuitry member of claim 11, wherein each of said pairs of said first and second pseudo-twisted conductors includes alternating straight and oblique sections, said oblique sections crossing the centerline of each of said pairs of said first and second pseudo-twisted conductors and said straight sections of each of said first and second pseudo-twisted conductors of each of said pairs of said first and second pseudo-twisted conductors being alternatingly positioned on opposite sides of said centerline.

15. The flexible printed circuitry member of claim 14 wherein the straight sections of each of said first and second pseudo-twisted conductors of each of said pairs of said first and second pseudo-twisted conductors are of uniform width.

16. The flexible printed circuitry member of claim 15, wherein each of said oblique sections of each of said first and second pseudo-twisted conductors of each of said pairs of first and second pseudo-twisted conductors extends from a peak location a maximum distance from its respective centerline to one of said crossover points and decreases in width uniformly as it extends towards said one of said crossover points.

17. The flexible printed circuitry member of claim 11 wherein each said twist length of each of said pairs of said first and second pseudo-twisted conductors range from 0.5 to 1.5 times a given medium length.

* * * * *